(12) United States Patent
Masumoto et al.

(10) Patent No.: US 8,115,310 B2
(45) Date of Patent: Feb. 14, 2012

(54) COPPER PILLAR BONDING FOR FINE PITCH FLIP CHIP DEVICES

(75) Inventors: Kenji Masumoto, Hiji-machi (JP); Mutsumi Masumoto, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 279 days.

(21) Appl. No.: 12/482,855

(22) Filed: Jun. 11, 2009

(65) Prior Publication Data
US 2010/0314745 A1 Dec. 16, 2010

(51) Int. Cl.
*H01L 23/48* (2006.01)
(52) U.S. Cl. . 257/738; 257/737; 257/778; 257/E23.021; 257/E23.069; 438/613
(58) Field of Classification Search .......... 257/737, 257/738, E23.021, E23.069, 778; 228/180.22; 438/613
See application file for complete search history.

(56) References Cited

U.S. PATENT DOCUMENTS
5,796,591 A * 8/1998 Dalal et al. ............. 361/779
7,473,580 B2 * 1/2009 Farooq et al. ........... 438/108
2008/0303142 A1* 12/2008 Kim et al. ............... 257/737

* cited by examiner

*Primary Examiner* — Jasmine Clark
(74) *Attorney, Agent, or Firm* — Steven A. Shaw; W. James Brady; Frederick J. Telecky, Jr.

(57) ABSTRACT

A semiconductor device assembly can include a semiconductor chip, a receiving substrate, and a spacer structure interposed between the semiconductor chip and the receiving substrate. The spacer provides an unoccupied space between a pillar and a bond finger for excess conductive material, which can otherwise flow from between the pillar and bond finger and result in a conductive short. The spacer can also provide an offset between the pillar and bond finger.

18 Claims, 4 Drawing Sheets

COPPER PILLAR BONDING FOR FINE PITCH FLIP CHIP DEVICES

FIELD OF THE INVENTION

This invention relates to the field of electronics manufacture, and more specifically to a method and structure for electrical connections between a semiconductor chip and a substrate which receives the semiconductor device.

BACKGROUND OF THE INVENTION

Integrated circuit (IC) packaging plays a vital role in the continued development of integrated circuits. The IC device can include a semiconductor die (chip, wafer section), and some form of packaging which protects the chip. Packaging can be a significant factor in the overall performance and desirability of the IC for a specific use. The size of the IC package which contains the chip, in part, dictates the final size of the electronic device containing the IC. Further miniaturizing semiconductor packages is a continuing goal of design engineers.

Various package designs have been developed in an attempt to minimize the size of the completed device. A wafer chip scale package (WCSP) device provides a small device footprint and offers a compact package for integrated circuits, as a resin encapsulation is not required. With a WCSP device, solder balls, solder bumps, posts such as copper posts, etc., can be directly attached to interconnect terminals of the semiconductor chip. The active surface of the semiconductor chip can be protected by a patterned passivation layer which can include, for example, various polymers, organic materials, etc., which protects the active surface of the semiconductor chip. The chip and solder balls are placed active-side down on a PCB or other substrate in a flip chip style attachment, and the solder balls are reflowed to electrically couple the bond pads on the chip with conductive lands on the PCB.

SUMMARY OF THE EMBODIMENTS

In contemplating conventional semiconductor device packages such as copper pillar bump flip chip packages, the inventors have realized that problems of electrical shorting can arise, particularly as copper post pitches continue to decrease. As depicted in FIG. 1, a conventional semiconductor device 10 can include a semiconductor substrate 12 such as a semiconductor die having an active surface with circuitry thereon and therein (not individually depicted) and interconnect terminals electrically coupled with the circuitry (not individually depicted). FIG. 1 further depicts cylindrical posts 14 such as copper posts electrically coupled with interconnect terminals on the active surface of the substrate 12 to provide an input/output connection to the circuitry of the die 12. The posts 14 can be formed on the interconnect terminals of the chip 12 using a plating mask and a plating process. A support structure or receiving substrate 16 can include a support layer 18, for example a printed circuit board, ceramic substrate, or another semiconductor layer, having circuitry thereon and therein (not individually depicted), and a plurality of bond fingers (i.e. bumps, landing pads) 22 which electrically connect to the circuitry on and in the support layer 18. Conductive balls (solder balls) 22 or another conductor can be formed on the pillars 14 as depicted or on the bond fingers 20. While two conductive paths between semiconductor substrate 12 and support layer 18 are depicted, it will be understood that conductive paths for a chip can number in the tens or hundreds.

To electrically connect the semiconductor device 10 to the receiving substrate 16 and complete the conductive paths, the solder balls 22 can be placed in contact with the bond fingers 20, then heated to flow the material such that electrical contact between the bond fingers 20 and the copper pillars 14 is made through the material of the solder balls 22.

As post pitches decrease, a failure mode similar to that depicted in FIG. 2 can result. In the depicted structure, the solder balls 22 have deformed as a result of the flow of solder material and the opposing pressure applied between the semiconductor device 10 and the receiving substrate 16. The solder material 22 can flow or be forced from between the flat surfaces of the copper pillars 14 and the bond fingers 20, and contact an adjacent deformed solder ball as depicted. Thus the two separate electrical signals provided by the two separate conductive paths can be shorted together and result in an unreliable or nonfunctional device.

In an embodiment of the present invention, the inventors have developed a structure interposed between the die 12 and the receiving substrate 18 which can decrease the likelihood of device shorting which can result from excess solder in a conventional device. In an embodiment, the bond finger can be formed to have a shape which can better manage an excess of conductive material without shorting to an adjacent electrical connection. In contrast to a bond finger 20 having a uniform width from a flat upper surface to a bottom portion which connects to the receiving substrate 18 as depicted in FIG. 1, a bond finger in one embodiment of the present invention can have a tapered profile and form a truncated cone which can accept an overflow of material to provide a reliable connection.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts.

Figure 1:
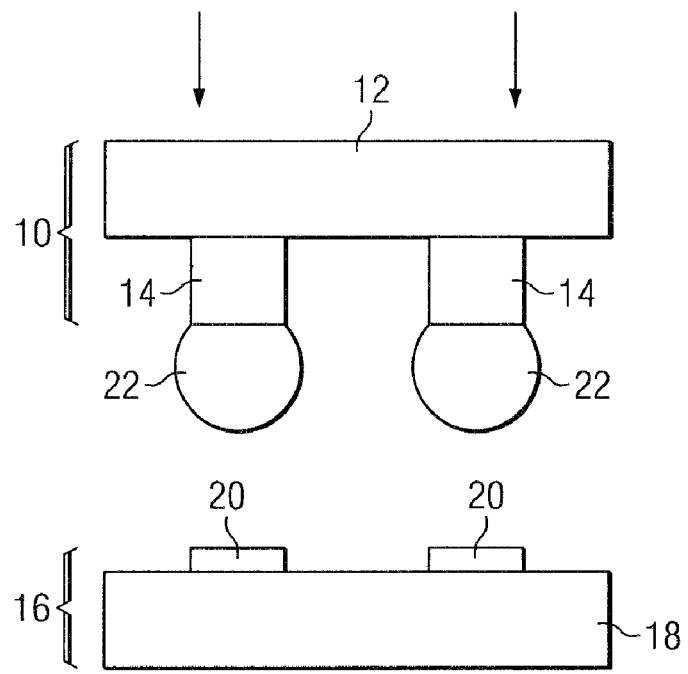
FIGS. 1 and 2 are cross sections of a related art device including a semiconductor die and a receiving substrate.
Figure 2:
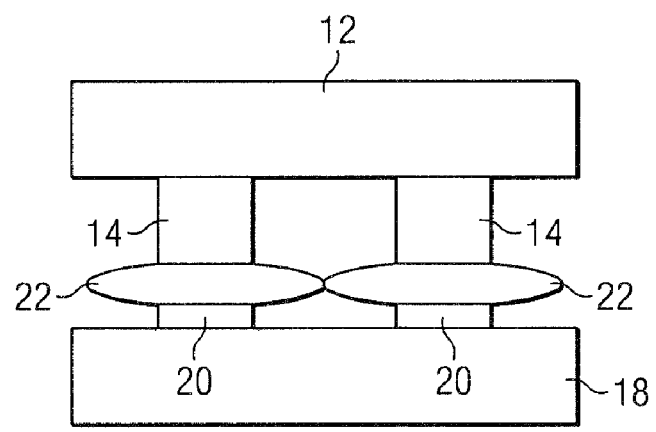
Figure 3:
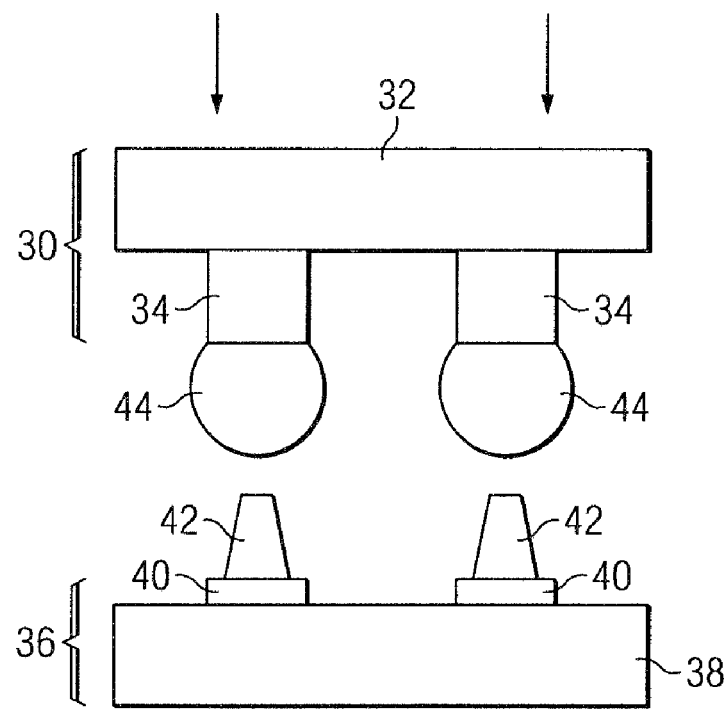
FIGS. 3 and 4 are cross sections of an embodiment of the invention including a semiconductor die, a receiving substrate, and spacer structures.

FIG. 3 depicts an embodiment of the invention including a semiconductor device 30 having a semiconductor die 32 with circuitry formed thereon and therein (not depicted). The semiconductor device 30 can also include interconnected terminals (not depicted) formed on an active surface of the device which are electrically coupled with the device circuitry. Also depicted are conductive pillars 34, for example copper pillars electrically coupled to the device circuitry, for example by connection with the interconnect terminals.

FIG. 3 further depicts a receiving substrate 36 including a support layer 38, for example a printed circuit board, ceramic substrate, or another semiconductor layer. The support layer 38 can have circuitry thereon and therein (not depicted). Bond fingers 40 are formed to electrically couple with circuitry of the support layer 38.

Also depicted are spacer structures (spacers) 42 which, in the depicted embodiment, have a tapered profile and form a truncated cone, and conductive material 44, for example solder balls.

In one exemplary embodiment of a spacer 42 having a truncated cone shape similar to FIG. 3, the pillars 34 can have a diameter of about 25 micrometers (μm), the bond fingers 40 can have a width of about 25 μm, and the spacer 42 can have an upper diameter of between about 5 μm and about 15 μm, a lower diameter of between about 10 μm and about 20 μm, and a height of between about 10 μm and about 20 μm.

Figure 4:
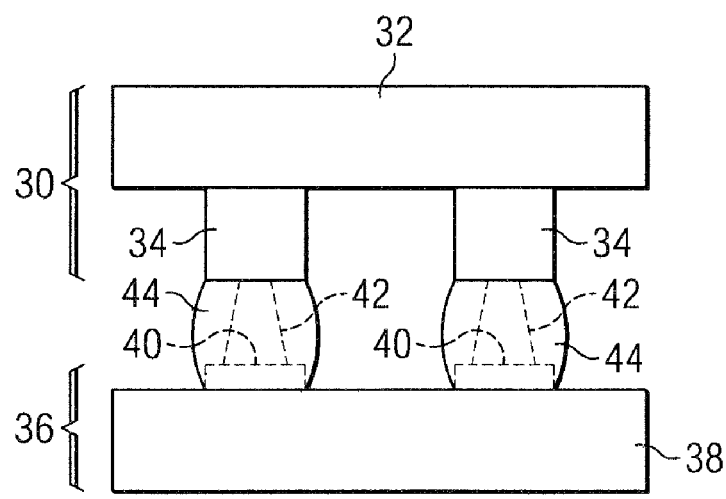

After providing structures similar to those of FIG. 3, the solder balls 44 are heated until they flow and placed in contact with the spacers 42. As the solder flows, devices 30 and 36 can be urged toward each other until an upper surface of each spacer 42 physically contacts the pillar 34 as depicted in FIG. 4.

Figure 5:
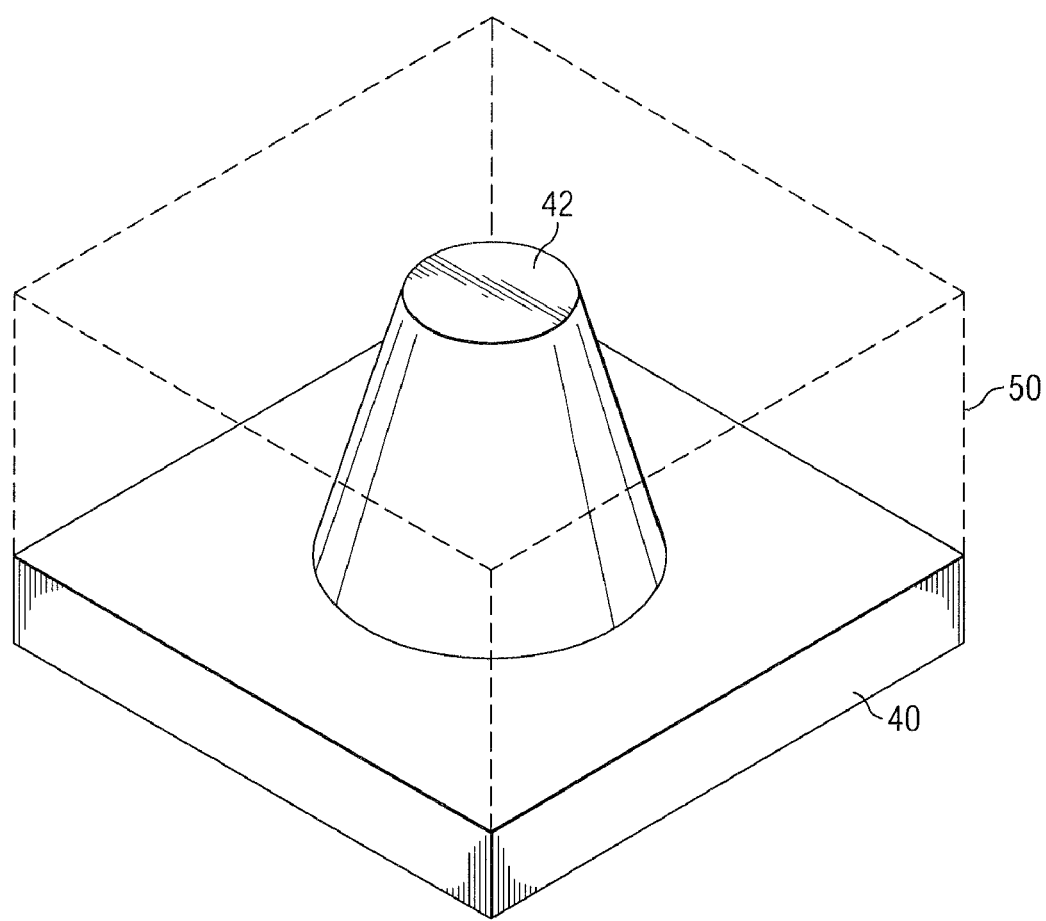
FIG. 5 is a perspective depiction of a spacer and bond finger, and a volume which can receive a quantity of conductive material such as solder.
Figure 6:
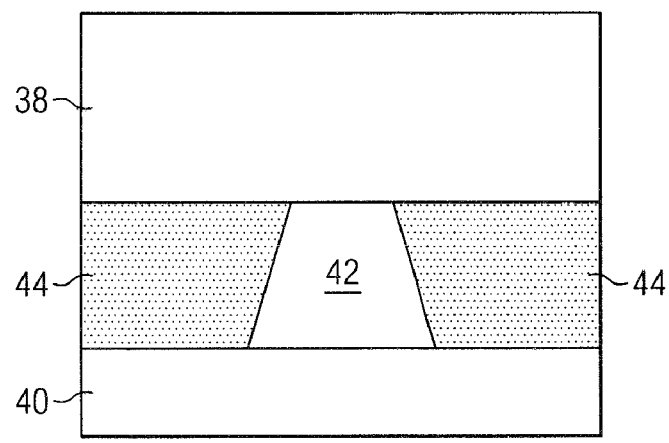
FIG. 6 is a cross section depicting another embodiment of the invention.
Figure 7:
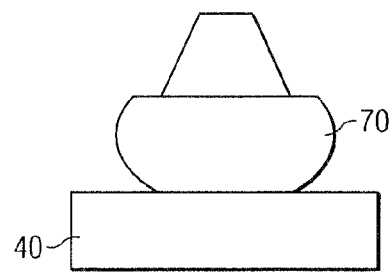
FIGS. 7 and 8 are cross sections depicting another embodiment of the invention.

FIG. 5 depicts an expanded perspective view of a bond finger 40 and the spacer structure 42, and FIG. 6 depicts a cross section of the bond finger 40, the spacer 42, the pillar 34, and solder 44. In use, the spacers 42 can provide various functions described below.

By providing a spacer 42 which is narrower than the pillar 38 and the bond finger 40, an unoccupied volume 50 is provided in a location lateral to the spacer 42 which functions as a storage area for solder 44. Particularly, excess solder which may otherwise be forced from between the flat surfaces of the bond finger 40 and the pillar 38 during attachment of the semiconductor die and the support remains in the unoccupied volume 50 around the spacer 42 and within a perimeter of the bond finger 40 and the pillar 38.

Further, structure 42 can provide an increased surface tension with the solder while it is in a liquid state so that the solder does not flow from between the flat surfaces of the bond finger 40 and the pillar 34. This increased surface tension can help maintain the solder within the perimeter of the pillar 38 and bond finger 40 while the solder is molten.

Additionally, the spacer 42 provides an offset between the flat surfaces of the pillar 38 and the bond finger 40. This prevents the flat surfaces from coming together during assembly, which can force the solder from between the two surfaces. By adjusting the height and shape of the spacer, the volume of solder between the two surfaces can be more easily controlled.

As depicted in the FIG. 6 cross section, the spacer is forms a truncated cone and is interposed between the semiconductor chip and the receiving substrate, and more specifically between the pillar 38 and the bond finger 40. The spacer 42 has a first portion proximate the pillar 38 having a first width, and a second portion proximate the bond finger 40 having a second width wider than the first width. In the FIG. 6 cross section, a volume of solder proximate the pillar 38 is greater than the volume of solder proximate the bond finger due to the spacer being wider at the bottom than at the top (as depicted). The conductive material electrically couples the semiconductor chip to the receiving substrate and electrically contacts the spacer at the first portion and the second portion, and more particularly along its entire height.

The spacers 42 can be formed as a part of the same material as bond fingers 40, for example using a stamping process, a subtractive etching process, a plating process, etc. In one embodiment, a metal layer having a thickness about equal to the combined height of the bond finger 40 and the spacer 42 is formed, and a patterned mask layer, for example a photoresist mask, is formed over the metal layer. In the case of the FIG. 5 structures, the photoresist can be patterned with a plurality of circular photoresist portions. The metal layer can then be partially etched using an anisotropic plasma or wet etch to form the conical structures as depicted.

In another embodiment, the spacers can be formed from a material different than the material of the bond fingers. For example, a first metal layer of gold, aluminum, an alloy, etc. can be formed to provide the bond fingers, then a blanket second layer, for example copper, can be formed which will provide the spacers 42. A mask, for example a photoresist patterned in accordance with the previous embodiment, can be formed on the copper layer, then the copper layer is etched using the photoresist mask as a pattern. An anisotropic plasma or wet etch using known etchants and stopping on the bond finger layer may sufficiently form a cone structure as depicted in FIG. 5. The etch can be stopped on the underlying bond finger layer to provide the truncated cone spacer structures as depicted in FIG. 5.

In another embodiment, the spacers can be formed using a casting process using a mold. The spacers can then attached to the bond finger, for example using a material similar to a die attach adhesive or by using a thermosonic bonding process.

The spacer structures can also be formed using a plating process. For example, a plating resist having an opening over the bond fingers can be formed, then the spacers can be formed in the opening on the bond finger using a plating process to bond the spacer to the bond finger.

While a spacer formed from a conductive material is believed to provide a connection having a minimum conductive resistance between the pillar 38 and the bond finger 40, it is believed that a nonconductive spacer may also function sufficiently. The solder 44 which physically contacts the spacers, and which physically and electrically contacts the pillars and the bond fingers, may have adequate volume to provide a sufficiently low-resistance contacts with nonconductive spacers. Using nonconductive spacers, the resistance of the connection would decrease as the size of the spacers decreases. Thus it is contemplated that the spacers can be formed from conductive materials such as various metals and alloys, or from nonconductive materials such as ceramic, plastic, or resin.

Shapes other than the truncated cone depicted can also be used. For example, cylinders, cubes, and spheres are also contemplated. As depicted in FIG. 5, the perimeter of the spacer 42 can be located within the perimeters of the bond finger 40 and the pillar 38 (FIG. 6) as depicted to provide an unoccupied volume for solder around the entire perimeter of the spacer 42.

Figure 8:
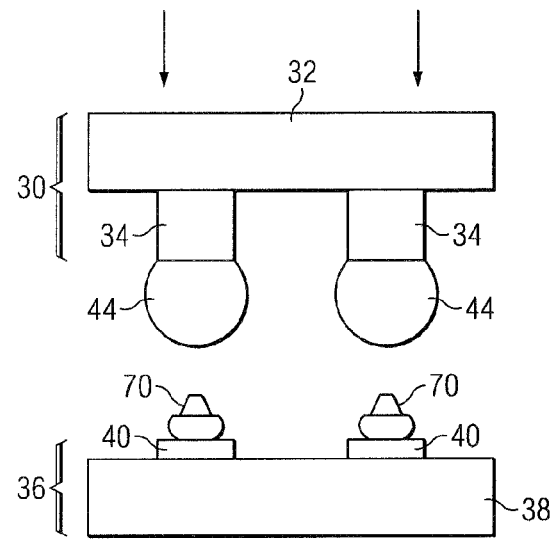

In another embodiment, a spacer 70 can be formed on the bond finger using a metal bump such as a gold stud bump, a copper stud bump, or other metal wire, for example using a wire bonding apparatus. The wire bond apparatus can be modified to provide a very short bond wire as depicted which, when complete, electrically connects at a first end to the bond finger 40 but does not have an electrical connection on the opposite, second end. After forming spacer 70, a semiconductor die can be urged toward the receiving substrate 36 and the stud bump 70 as depicted in FIG. 8, the solder can be heated until molten, and the electrical connection between the pillars 34 and the bond fingers 40 can be completed.

Figure 9:
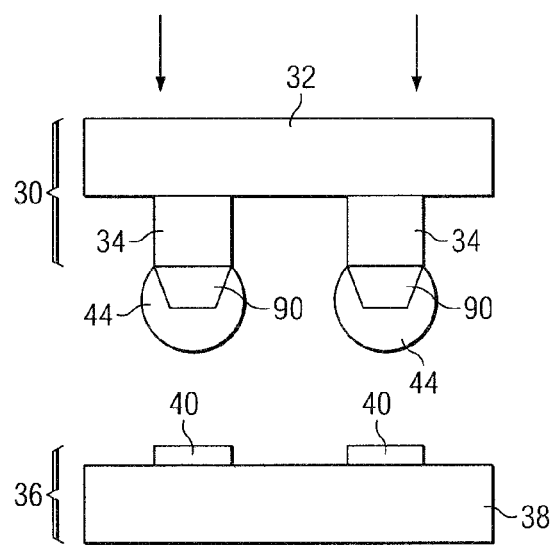
FIG. 9 is a cross section depicting another embodiment of the invention.

FIG. 9 depicts another embodiment in which the pillars 34 have "sharpened" portions 90 which can be formed integral with the pillars (i.e. formed from the same conductive layer as the pillars 34). In this embodiment, the bond fingers 40 are flat and have no spacer formed thereon.

In other embodiments, the spacers can be formed to on the semiconductor die 30 rather than on the bond fingers of the receiving substrate 36 as previously described. For example, the spacers can be formed on bond pads or other metallization pads of the semiconductor die. Whether the spacers are formed on the semiconductor die or on the receiving substrate, the spacers are interposed between the semiconductor die 32 and the support layer 38, and more specifically interposed between the pillar 34 and the bond finger 40. The solder surrounding the spacer and the spacer itself (if formed from a conductive material) completes the electrical connection between the pillar and the bond finger. If the spacer is nonconductive, then the electrical connection is completed by the solder alone.

It is contemplated that a spacer can be used in various embodiments on a back side of the die or support layer, for example in the case where a through-silicon via (TSV) has been formed.

In the various embodiments (referring to FIG. 6), the spacer 42 can be formed from a material having a higher melting temperature than the conductive material 44, so that spacer 42 can withstand contact from the pillar 38 (if the spacer 42 is formed on the bond finger) or the bond finger 40 (if the spacer is formed on the pillar 38) as the semiconductor die and receiving substrate are urged together.

While specific exemplary embodiments of the invention are detailed above with reference to "pillars" and "bond fingers," these terms are meant to include layers such as bond pads, interconnect terminals, landing pads, and other metallization layers of a semiconductor die, receiving substrate, etc. Further, various embodiments can be used with unencapsulated semiconductor devices such as wafer chip scale packages (WCSP), encapsulated semiconductor devices such as ball grid array (BGA) devices, back side connections such as those found with TSV devices, etc.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A semiconductor device comprising:
a semiconductor chip comprising electrical circuitry;
a receiving substrate;
a plurality of spacers each with a shape of a truncated cone interposed between the semiconductor chip and the receiving substrate, wherein each spacer, in cross section, has a first portion of a first width and a second portion of a second width wider than the first width; and
a conductive material which electrically couples the semiconductor chip to the receiving substrate, wherein the conductive material physically contacts each spacer at both the first portion and the second portion.

2. The semiconductor device of claim 1, further comprising, in cross section, a first volume of the conductive material at the first portion of each spacer and a second volume of the conductive material at the second portion of each spacer, wherein the first volume is greater than the second volume.

3. The semiconductor device of claim 1, wherein each spacer is a portion of a bond wire.

4. The semiconductor device of claim 1 further comprising a plurality of copper pillars, wherein the second portion of each spacer is connected to one of the plurality of copper pillars, and each copper pillar is electrically coupled to a metallization layer of the semiconductor chip.

5. The semiconductor device of claim 1 further comprising a plurality of bond fingers, wherein the second portion of each spacer is connected to one of the plurality of bond fingers, and each bond finger is electrically coupled to a metallization layer of the receiving substrate.

6. The semiconductor device of claim 1, wherein the plurality of spacers are nonconductive.

7. The semiconductor device of claim 1, wherein a distance from the semiconductor chip to the receiving substrate is at least partially determined by a height of the plurality of spacers.

8. A semiconductor device comprising:
- a semiconductor chip comprising electrical circuitry and a plurality of conductive pads electrically coupled with the circuitry, wherein each conductive pad has a perimeter;
- a receiving substrate comprising electrical circuitry and a plurality of conductive pads electrically coupled with the circuitry of the receiving substrate, wherein each conductive pad of the receiving substrate has a perimeter;
- a plurality of spacers, wherein each spacer comprises a first end contacting a pad of the semiconductor chip and a second end contacting a pad of the receiving substrate, wherein the first end of each spacer has a perimeter smaller than the perimeter of each conductive pad of the semiconductor chip, and the second end of each spacer has a perimeter smaller than the perimeter of each conductive pad of the receiving substrate; and
- a conductive material which electrically couples each of the plurality of conductive pads of the semiconductor chip to one of the interconnect pads of the receiving substrate, and physically contacts each spacer at the first end and the second end.

9. The semiconductor device of claim 8 wherein each of the plurality of spacers is nonconductive.

10. The semiconductor device of claim 8 wherein each spacer is the shape of a truncated cone.

11. The semiconductor device of claim 8, wherein each spacer is a portion of a bond wire.

12. A method used to form a semiconductor device comprising:
- forming a plurality of spacers to have the shape of a truncated cone;
- interposing the plurality of spacers between a semiconductor chip and a receiving substrate wherein each spacer, in cross section, has a first portion of a first width and a second portion of a second width wider than the first width; and
- electrically coupling the semiconductor chip to the receiving substrate with a conductive material wherein, during the electrically coupling, the conductive material is formed to physically contact each spacer at both the first portion and the second portion.

13. The method of claim 12, further comprising, during the electrically coupling:
- providing a first volume of the conductive material at the first portion of each spacer; and
- providing a second volume of the conductive material at the second portion of each spacer, wherein the first volume is greater than the second volume.

14. The method of claim 12, further comprising:
- providing a plurality of bond wires which form the plurality of spacers, then;
- interposing the plurality of bond wires between the semiconductor chip and the receiving substrate during the interposing of the plurality of spacers between the semiconductor chip and the receiving substrate.

15. The method of claim 12, further comprising:
- electrically connecting a plurality of copper pillars to a metallization layer of the semiconductor chip;
- electrically connecting a plurality of bond fingers to a metallization layer of the receiving substrate;
- contacting the second portion of each spacer to one of the plurality of copper pillars; and
- contacting the first portion of each spacer to one of the plurality of bond fingers.

16. The method of claim 12, further comprising:
- electrically connecting a plurality of copper pillars to a metallization layer of the semiconductor chip;
- electrically connecting a plurality of bond fingers to a metallization layer of the receiving substrate;
- contacting the first portion of each spacer to one of the plurality of copper pillars; and
- contacting the second portion of each spacer to one of the plurality of bond fingers.

17. The method of claim 12, further comprising:
- providing a plurality of nonconductive spacers; and
- interposing the plurality of nonconductive spacers between the semiconductor chip and the receiving substrate during the interposing of the plurality of spacers between the semiconductor chip and the receiving substrate.

18. The method of claim 12 further comprising forming the plurality of spacers to have a height] wherein the height of the plurality of spacers at least partially determines a distance from the semiconductor chip to the receiving substrate.

* * * * *